(12) United States Patent
Li et al.

(10) Patent No.: US 8,809,172 B2
(45) Date of Patent: Aug. 19, 2014

(54) SELF-ALIGNED PATTERNING FOR DEEP IMPLANTATION IN A SEMICONDUCTOR STRUCTURE

(71) Applicant: Taiwan Semiconductor Manufacturing Company, Ltd., Hsinchu (TW)

(72) Inventors: Chen-Yan Li, Taichung (TW); Shih-Chi Fu, Zhudong Township (TW); Ching-Sen Kuo, Taipei (TW); Wen-Chen Lu, Kaohsiung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/839,888

(22) Filed: Mar. 15, 2013

(65) Prior Publication Data
US 2013/0323917 A1    Dec. 5, 2013

Related U.S. Application Data

(60) Provisional application No. 61/655,219, filed on Jun. 4, 2012.

(51) Int. Cl.
*H01L 21/425*    (2006.01)

(52) U.S. Cl.
USPC .......................................................... 438/527

(58) Field of Classification Search
USPC .......................................................... 438/527
See application file for complete search history.

(56) References Cited

U.S. PATENT DOCUMENTS

| 8,367,512 | B2 * | 2/2013 | Fu et al. | 438/375 |
| 2011/0201171 | A1 * | 8/2011 | Disney et al. | 438/404 |
| 2013/0323876 | A1 * | 12/2013 | Lu et al. | 438/73 |

\* cited by examiner

*Primary Examiner* — Bradley K Smith
(74) *Attorney, Agent, or Firm* — Lowe Hauptman & Ham, LLP

(57) ABSTRACT

Methods of forming self-aligned patterns for performing oppositely doped deep implantations in a semiconductor substrate are disclosed. The semiconductor substrate has implantation and non-implantation regions. The methods include forming a hardmask pattern for a first implantation with a first conductivity-type dopant, depositing an etch stop layer, filling trenches between the hardmask pattern with a sacrificial filler material having a higher wet etch resistance than the hardmask, removing a top portion of the sacrificial filler material and the etch stop layer over a top surface of the hardmask pattern, removing the hardmask pattern in the implantation region by wet etching, and performing a second ion implantation with a second conductivity type dopant opposite of the first conductivity type.

20 Claims, 17 Drawing Sheets

SELF-ALIGNED PATTERNING FOR DEEP IMPLANTATION IN A SEMICONDUCTOR STRUCTURE

CROSS-REFERENCE TO RELATED APPLICATION

The present application claims the priority of U.S. Provisional Application No. 61/655,219, filed Jun. 4, 2012, the disclosure of which is incorporated herein by reference in its entirety.

TECHNICAL FIELD

The present disclosure relates generally to semiconductor manufacturing processes. More particularly, it relates to semiconductor processes for forming deep implantation within a semiconductor structure.

BACKGROUND

As feature sizes decrease in semiconductor manufacturing, using more than one photolithography exposure operation in one layer becomes more common. When multiple photolithography exposure operations are used, a specified overlay margin is built into the design so that the device formed does not become defective because of small alignment errors. However, such specified overlay margin limits a reduction in feature sizes as the overlay margin becomes larger in comparison to the feature size.

Smaller features also increase a use of deep implantation to implant a same amount of dopants in a smaller surface area. In one example, deep implantation is increasingly being used to form photosensitive regions and surrounding features as the surface area of photodiodes decrease. In other cases, deep implantation is used to form isolation regions in, for example, high voltage and/or high frequency applications. Deep implantation uses a higher implantation energy to drive the dopants deeper into the surface area; correspondingly, the higher implantation is applied to the implantation mask area. As result, a thicker implantation mask is used to prevent unwanted doping of areas under an implantation mask. Together with the smaller feature being doped, the aspect ratio of openings in implantation masks increases. The high aspect ratio opening has a tapered profile using conventional dry etch techniques, which reduces an effectiveness of the implantation mask and thus the maximum implantation energy that can be applied without unwanted doping. Therefore, improvements in deep implantation methods for multiple deep implantations at high energies continue to be sought.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
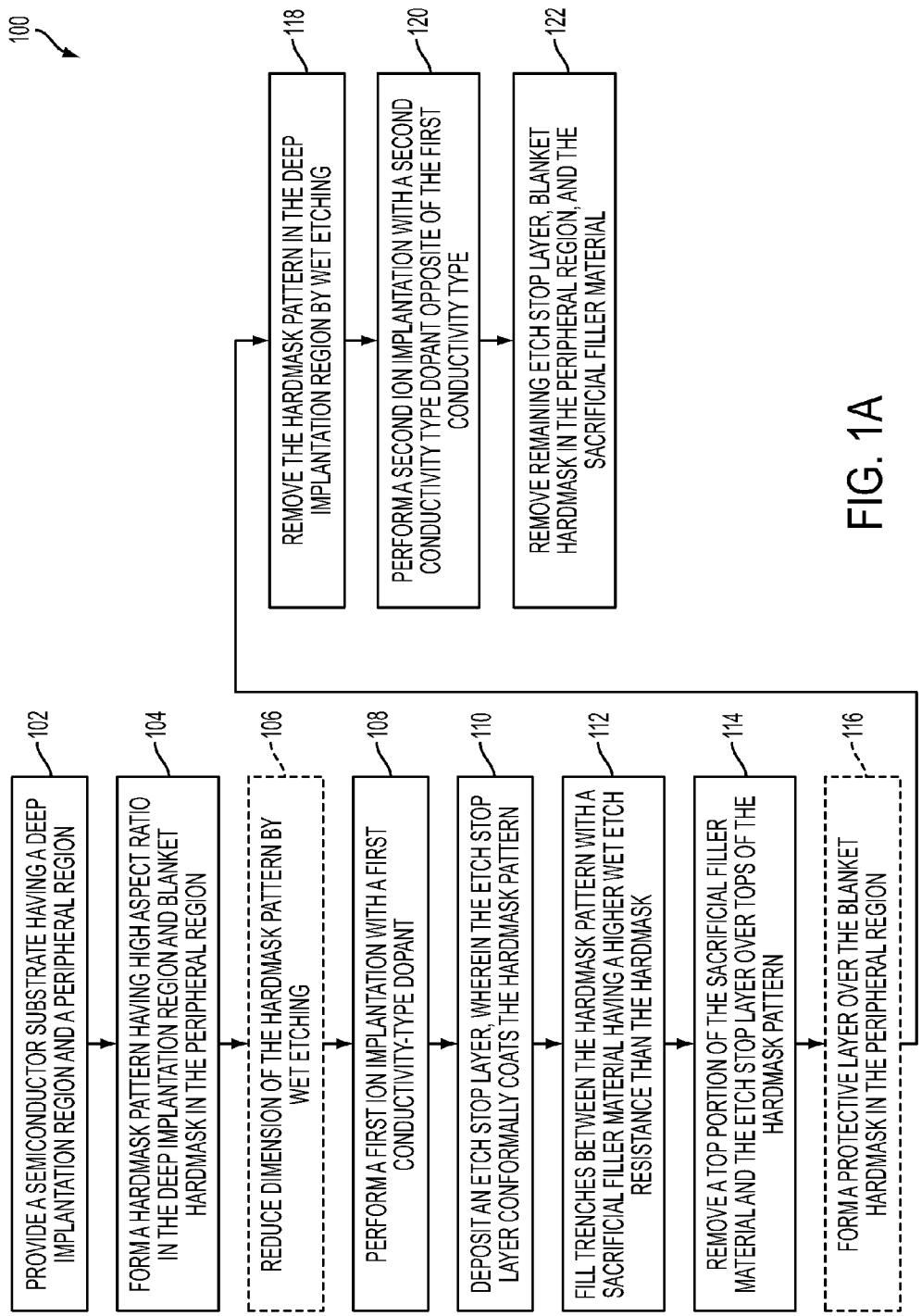
FIG. 1A is a flowchart of a method for manufacturing a semiconductor structure having self-aligned deep implantation according to one or more embodiments of the present disclosure.

The present disclosure relates generally to semiconductor processes for forming deep implantation. It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

During lithography exposure process, a semiconductor substrate are exposed to different patterns on a photomask in different operations. A substrate may be separated into many regions where each region is exposed using the same or different photomasks. To ensure that successive exposures are stacked correctly, alignment marks and overlay marks are used with other methods. Additionally, an overlay margin is built into the design to allow for small errors in alignment. For example, the overlay margin would ensure that even if an error during alignment occurs, the resulting features would not overlap each other to cause a defect in the final device. The effect of using overlay margins is cumulative because alignment errors may be additive in different regions of the semiconductor substrate. As feature sizes decrease, the effect of cumulative overlay margins reduces the gains from total device area from the smaller features.

Before a deep implantation, a thick oxide hardmask is deposited over a semiconductor substrate. The thickness of the oxide hardmask depends on the implantation energy. The thick oxide hardmask is patterned using a first photomask to create a pattern having a first critical dimension (CD). The thick oxide hardmask is then etched according to the pattern to the semiconductor substrate to form an opening. For deep implantations at high energies, for example, above 100 keV, above 150 keV, or above 180 keV, the oxide hardmask has to absorb all unwanted dopants so that the unwanted dopants do not reach the semiconductor substrate below the oxide hardmask while the etched opening allows implantation of the semiconductor substrate directly below the opening. According to one or more embodiments, because a thicker oxide hardmask is required to block the unwanted dopants, an aspect ratio of the opening for deep implantation is 12 or greater.

Because the opening or trench has a high aspect ratio, a resulting critical dimension at a bottom of the trench is not necessarily the same as the first CD of the photomask after etching. The etch process may create a tapered profile for the trench so that the opening at the top of the oxide hardmask becomes bigger as the trench is being opened. The tapered profile creates a bottom opening of the hardmask at the semiconductor substrate that is smaller than a top opening of the hardmask. The angle of the tapering depends on the geometry etched, the hardmask material and the etch process conditions. During the deep implantation, the tapered profile causes a partial blocking of the dopants that enter the top opening of the hardmask. As the dopants enter the narrow bottom, some of the dopants are absorbed by the hardmask sidewall and some of the dopants enter the semiconductor substrate below the hardmask. The tapered profile of the trench can thus create uncertainty as to how much dopant enters the semiconductor substrate. In some cases, the semiconductor substrate includes shallow trench isolation features that can also absorb implanted dopant. A small misalignment would cause more or less of the implanted dose to reach the semiconductor substrate.

The angle of tapering affects quality of the deep implantation. For higher aspect ratio trenches, the difference between the top and bottom openings is greater using conventional dry etch processes. While etch processes parameters are tuned to reduce the angle and sometimes eliminate the angle, for example, using a deep trench etch process, the etch process may be slow and costly, especially since the very thick oxide hardmask is removed after the deep implantation.

When more than one deep implantation is implemented on the semiconductor substrate, the oxide hardmask and any intervening layers are removed from the semiconductor substrate before a second thick oxide hardmask is deposited and patterned using a second photomask. According to one or more embodiments, the second pattern includes a second CD different from the first CD and an amount of tapering is different from that of the first CD. A second deep implantation is performed and the layers removed. one or more embodiments, the first and second deep implantations create wells that are close together. In one or more embodiments, the wells include dopants having opposite conductivity types. The adjacent wells may be separated by a distance in the semiconductor substrate, which may include an isolation feature such as shallow trench isolation (STI). In one or more embodiments, the wells adjoin each other or are formed with a slight overlap. If the wells include dopant having a same conductivity type, then different implantations energies and dosages are used to create wells having different shapes, sometimes with an overlap portion. Depending on the semiconductor device for which the doped wells are used, a number of configurations are possible. In instances where adjacent wells are placed close together, the overlay between the first and second photomask must be accurate or structure designed in such as way so small errors in overlay do not so adversely affect the electrical properties of the semiconductor device to render it defective. Such design requires "overlay margins" that effectively enlarges the semiconductor device.

In some examples, deep implantation is used to create high aspect ratio wells for complementary metal-oxide-semiconductor (CMOS) image sensors (CIS). A deep photo diode and/or deep p-well are created using an oxide hardmask in two separate lithography-etch-lithography-etch processes. The deep photo diode and the deep p-well may be separated by STI features and have different CDs. The deep p-well uses a higher aspect ratio trench than the deep photo diode. In other examples, deep implantation is used to create high aspect ratio wells in high voltage devices, such as laterally diffused metal-oxide semiconductors (LDMOSs) and other power metal-oxide-semiconductor field-effect transistors (MOSFETs).

Figure 1B:
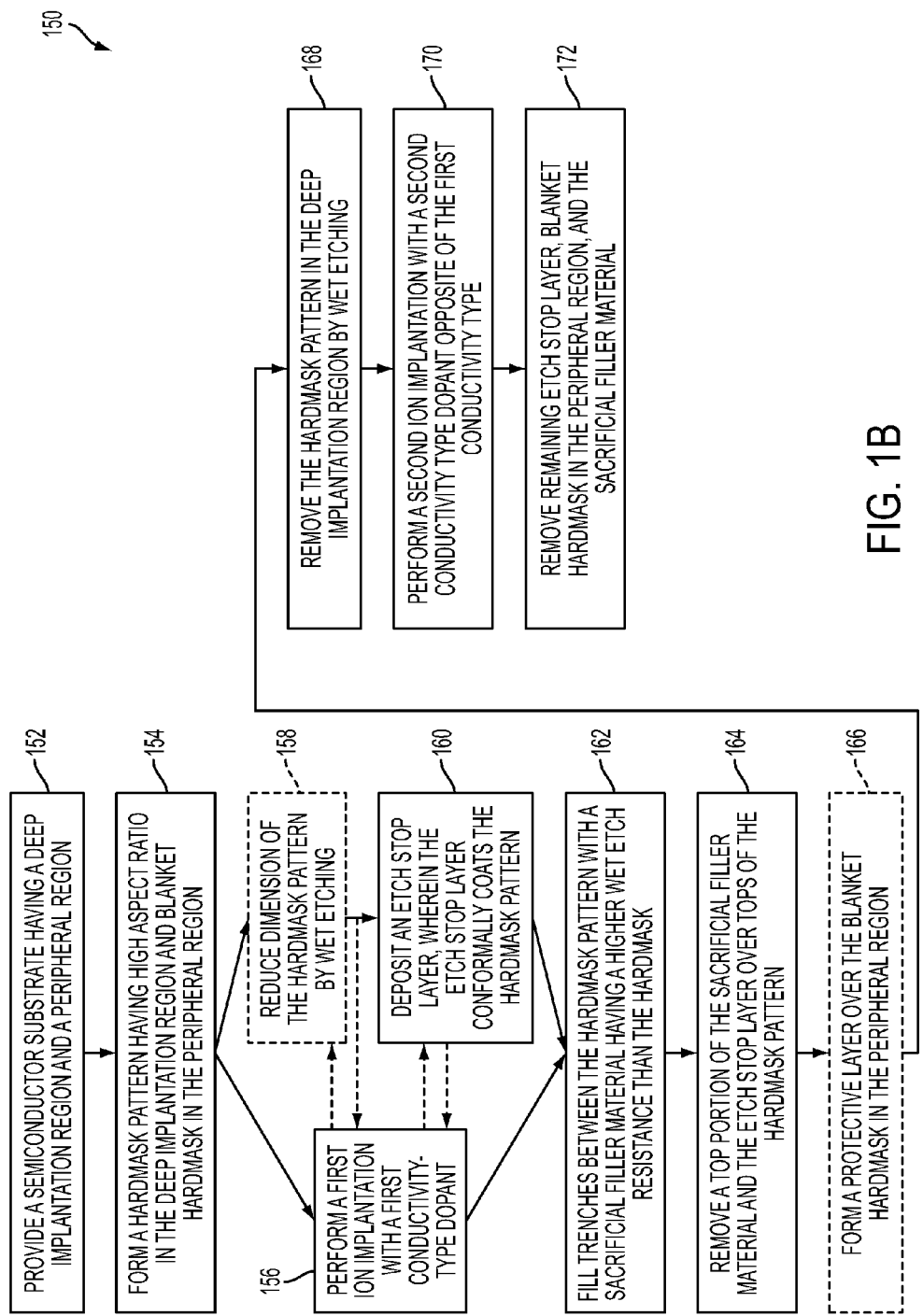
FIG. 1B is a flowchart of a method for manufacturing a semiconductor structure having self-aligned deep implantation according to one or more embodiments of the present disclosure.

FIGS. 1A and 1B are flowcharts of methods 100 and 150 for manufacturing a semiconductor device according to various embodiments of the present disclosure. The semiconductor device includes two or more deep implantations according to various embodiments of the present disclosure. FIGS. 2A through 2I are sectional views of a semiconductor structure 200 at various fabrication stages and constructed according to various embodiments corresponding to at least one embodiment of the method 100 of FIG. 1A. FIGS. 3A through 3F are sectional views of a semiconductor structure 300 at various fabrication stages and constructed according to various embodiments corresponding to some embodiments of the method 150 of FIG. 1B.

Figure 2A:
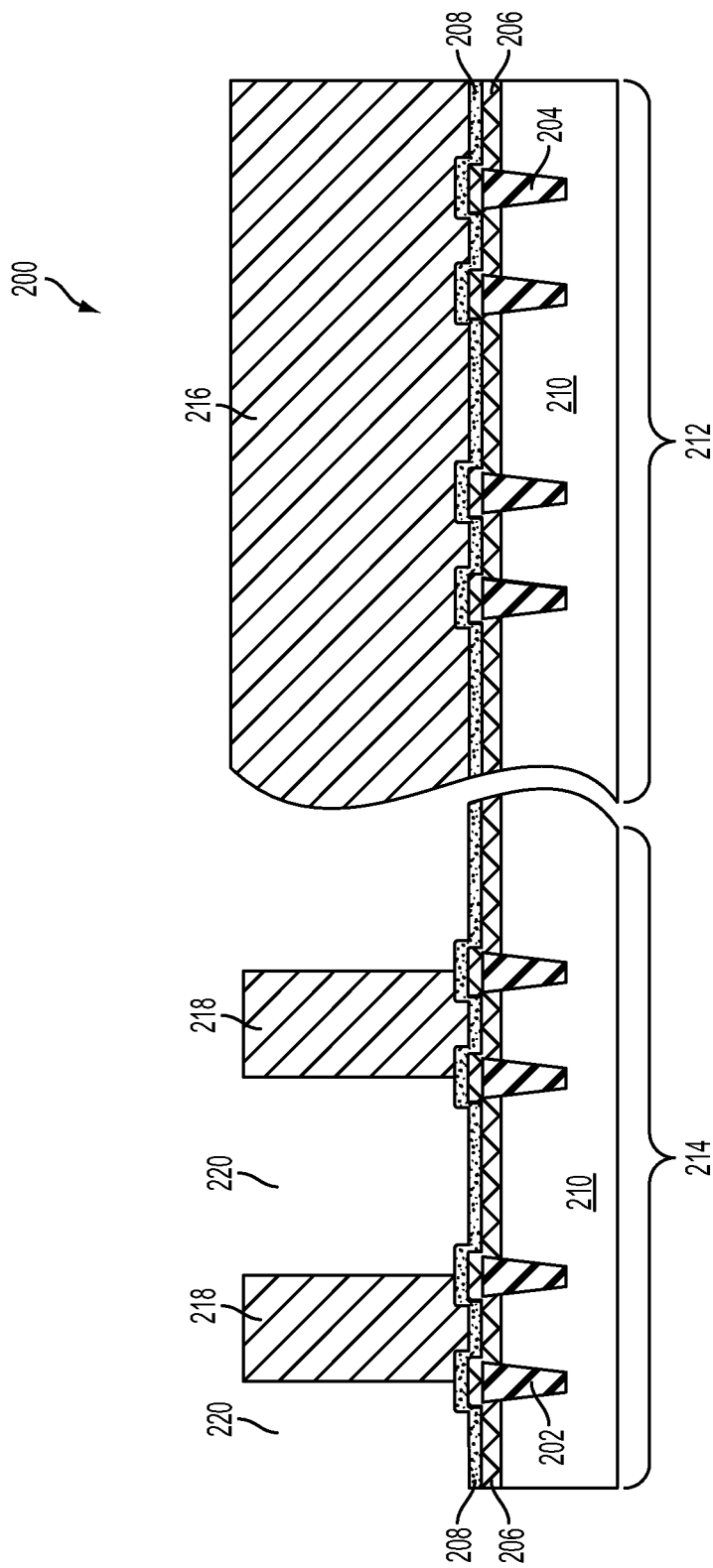
FIGS. 2A-2I are sectional views of a semiconductor structure having self-aligned deep implantation in various stages of semiconductor processing according to various embodiments of the present disclosure.

Referring to FIGS. 1A and 2A to 2I, the method 100 begins at step 102 by providing a semiconductor substrate 210. The semiconductor substrate 210 includes silicon having a deep implantation region 214 and a peripheral region 212 as shown in FIG. 2A. The deep implantations are desired only in the deep implantation region 214 and not in the peripheral region 212. Alternatively, the semiconductor substrate includes germanium, silicon germanium or other proper semiconductor materials. The semiconductor substrate 210 also includes various isolation features such as shallow trench isolations (STI) 202 and 204 formed in the semiconductor substrate to separate various features. Various STI features 202 and 204 are formed in the semiconductor substrate 210 in the device region. The formation of the STI features 202 and 204 includes etching a trench in the substrate 210 and filling the trench by one or more insulator materials such as silicon oxide, silicon nitride, or silicon oxynitride. The filled trench may have a multi-layer structure such as a thermal oxide liner layer with silicon nitride filling the trench. In one embodiment, the STI feature 202 and 204 is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI features. The STI features 202 and 204 may have a top surface planar with the substrate 210 or protrudes slightly from the substrate 210 as shown in FIG. 2A.

One or more layers may be deposited over the STI features 202 and 204 and the substrate 210, for example, layers 206 and 208. The layer 206 may be a polysilicon layer or a dielectric layer. The dielectric layer 208 may be a dielectric over the polysilicon layer or a second dielectric layer. The dielectric layer 206 or the other dielectric layer 208 may be an adhesion layer, for example, a silicon nitride layer, to improve the adhesion of the hardmask layer.

In step 104 of FIG. 1A, a hardmask pattern having a high aspect ratio is formed in the deep implantation region 214 and a blanket hardmask 216 is formed in the peripheral region 212. A hardmask layer is deposited over the adhesion layer (e.g., the dielectric layer 208) to pattern the deep implantation. The hardmask layer may be a silicon oxide hardmask or a silicon nitride hardmask. A photoresist is deposited over the hardmask and patterned to form deep implantation pattern over the deep implantation region 214 while the photoresist over the peripheral region is not patterned. A dry etch process etches the deep implantation pattern into the hardmask layer in the deep implantation region 214 to form hardmask pattern 218. Remaining photoresist is removed after the dry etch process is performed. Because the photoresist over the hardmask layer in the peripheral region 212 is not patterned, no hardmask pattern is formed in the peripheral region 212 and a blanket hardmask 216 remains over the peripheral region 212. According to one or more embodiments, the hardmask patterns 218 in the deep implantation region 214 have a high aspect ratio about or greater than 12. Between the hardmask patterns 218, trenches 220 are formed by the hardmask etch. According to various embodiments, the trenches 220 have an aspect ratio less than the hardmask pattern, for example, less than 12. According to one or more embodiments, the trenches 220 are easier to etch with little or no tapered profile (small or no tapering angle) because the aspect ratio is not high (12 or higher) and conventional etch processes may be used. In one example, the dry etch plasma includes gases of argon and carbon monoxide with small amounts of a fluorine-based gas.

Figure 2B:
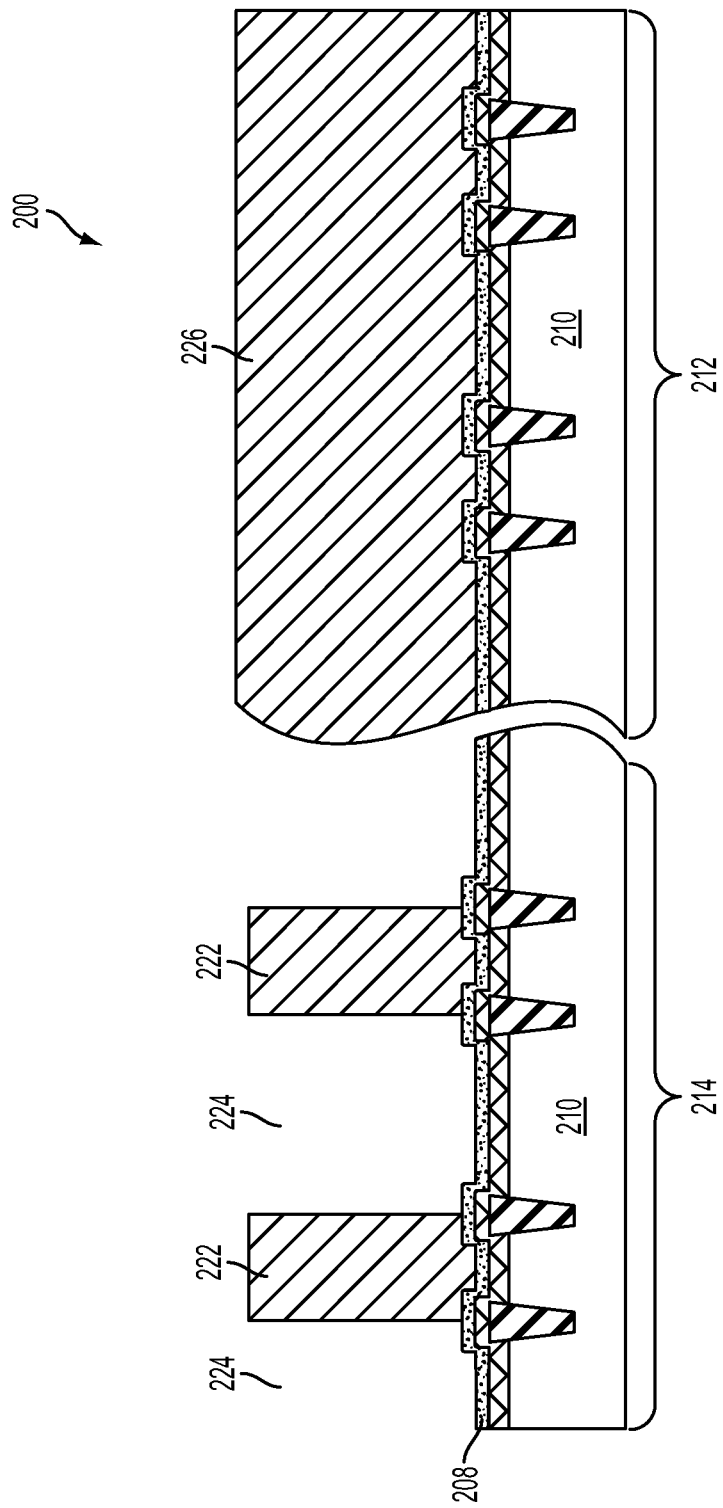

In optional step 106 of FIG. 1A (as indicated by the dashed line), dimensions of the hardmask pattern is reduced by wet etching. The intermediate semiconductor structure 200 of FIG. 2A is exposed a wet etchant, for example, a hydrofluoric acid (HF) based etchant, that has a higher etching selectivity for the hardmask material over the material of layer 208 below the hardmask pattern 218 and exposed in the trenches 220 by the hardmask etch. Because the hardmask pattern 218 has high aspect ratio, the wet etch increases the aspect ratio of the hardmask patterns 218 by removing substantially equal amounts of material from the sidewalls and the top of the hardmask patterns 218. The resulting structure is shown in FIG. 2B, including reduced hardmask pattern 222 and enlarged trenches 224 in the deep implantation region 214 and reduced blanket hardmask 226.

Figure 2C:
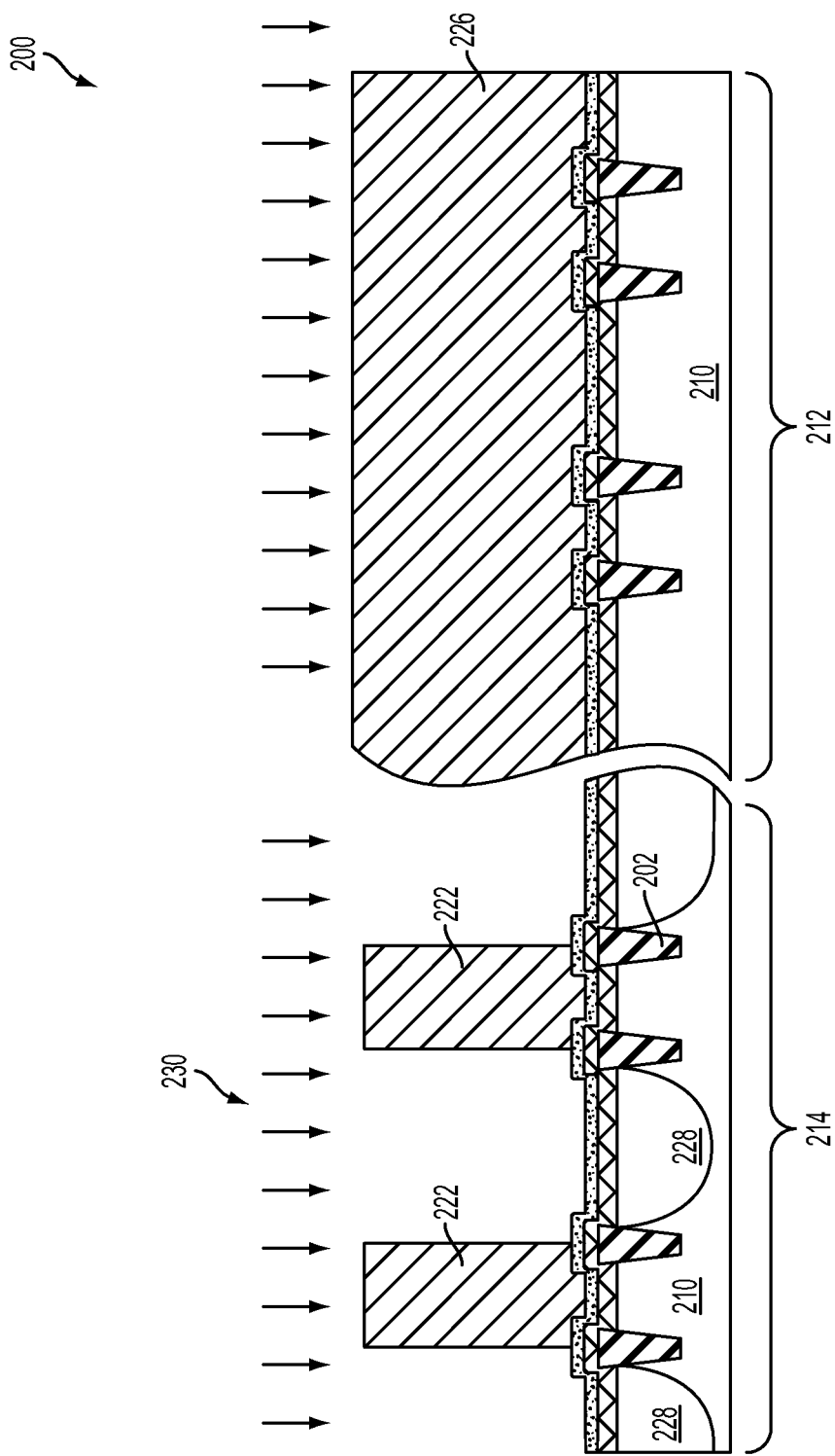

In step 108 of FIG. 1A, a first ion implantation is performed with a first conductivity-type dopant as shown in FIG. 2C. The first ion implantation bombards the semiconductor device 200 with dopant ions 230 at a first implantation energy greater than 100 keV to form first wells 228 in the deep implantation region 214 in the substrate 210. The first wells 228 align with the hardmask patterns 222 and/or the STI features 202. No well is formed in the peripheral region 212 as the blanket hardmask 226 blocks the dopant ions 230 from being implanted. In the example of a CIS, the first conductivity-type is a n-type dopant for forming a deep photo diode. In other examples, the first conductivity-type may be n-type or p-type.

Figure 2D:
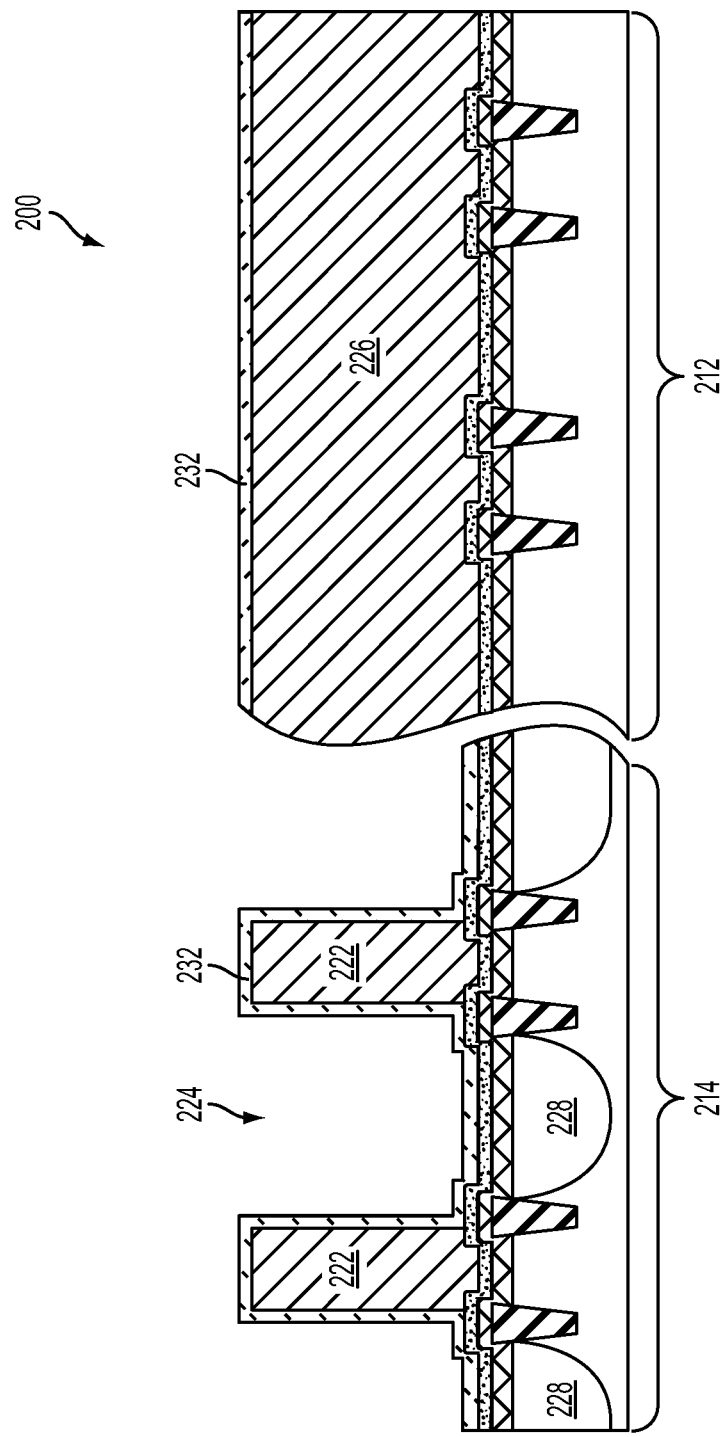

In step 110 of FIG. 1A, an etch stop layer is deposited to form a conformal layer around the hardmask pattern 222 and in the bottom of the trenches 224, as shown in FIG. 2D. The etch stop layer 232 may be a silicon nitride layer, a carbon doped silicon nitride layer, a silicon oxynitride layer, a metal oxide layer, or another material that is more resistant to wet etch using buffered or dilute HF than the hardmask pattern 222. The thickness of the etch stop layer 232 depends on the relative etch rate, or the etch selectivity, or the etch stop layer 232 relative to the hardmask pattern 222. The etch stop layer 232 is also deposited over the blanket hardmask 226 in the peripheral region 212.

Figure 2E:
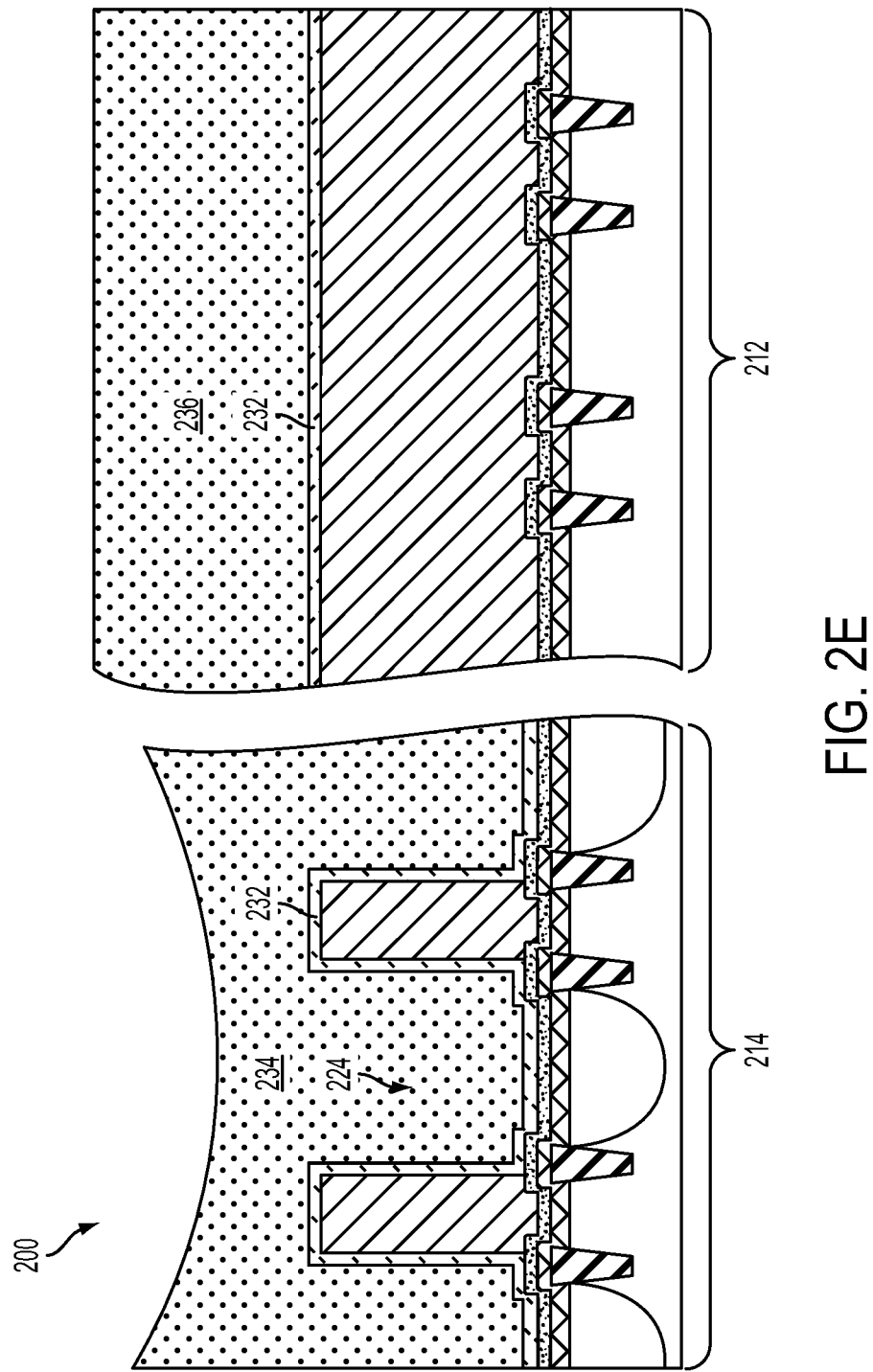

In step 112 of FIG. 1A, the trenches 224 between the hardmask pattern 222 is filled with a sacrificial filler material 238 having a higher wet etch resistance than the hardmask. As shown in FIG. 2E, the sacrificial filler material 238 may form different shapes in the deep implantation region 214 and the peripheral region 212. According to some embodiments, the sacrificial material is a photoresist that is first deposited and then cured without patterning. The photoresist having a certain viscosity is spun onto the partially fabricated semiconductor device 200. In the deep implantation region 214, the top surface of the photoresist 234 is dished. In the peripheral region 212, the top surface of the photoresist 236 is relatively flat. Thus, the sacrificial material thickness above the etch stop layer 232 can be different in the deep implantation region 214 and the peripheral region 212. In some embodiments, the sacrificial filler material 238 includes silicon nitride or another material that can be deposited to different thicknesses in a blanket region (peripheral region 212) and a patterned region (deep implantation region 214). The sacrificial filler material 238 has a higher wet etch resistance than the hardmask material, but its wet etch resistance may be lower than the etch stop layer 232. The sacrificial filler material also blocks dopant implantation in a subsequent step.

Figure 2F:
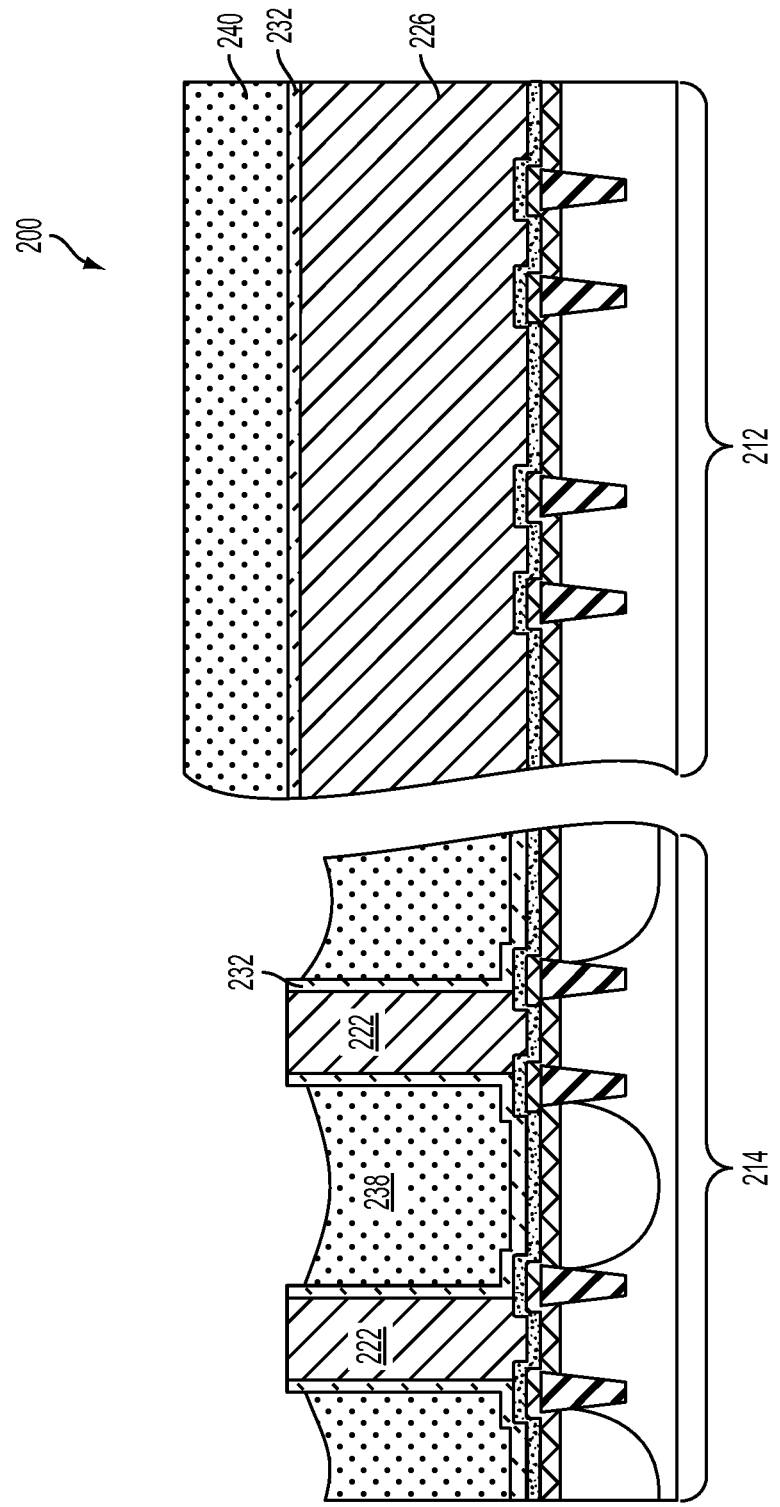

In step 114 of FIG. 1A, a top portion of the sacrificial filler material 238 and the etch stop layer 232 over the top of the hardmask pattern 222 is removed. The removal may be accomplished by a dry etch process or a wet etch process. For example, a phosphoric acid based solution may be used to etch the sacrificial filler material 238 and portions of the etch stop layer 232. The removal process does not remove the etch stop layer 232 over the blanket hardmask 226 in the peripheral regions 212 because the sacrificial filler material 238 deposits thicker over the blanket hardmask 226 than over the hardmask pattern 222. FIG. 2F is a cross section view of the intermediate semiconductor device 200 after the removal process. In the deep implantation region 214, a portion of the etch stop layer 232 is removed from the tops of the hardmask patterns 222 along with the sacrificial filler material 238 over the hardmask patterns 222. The remaining sacrificial filler material 238 in the deep implantation region 214 may have a dished shape as shown, depending on relative etch rates as compared to the etch stop layer removed. A small portion of the sacrificial filler material 240 remains over the etch stop layer 232 in the peripheral region 212.

In certain embodiments of steps 112 and 114, the sacrificial filler material 240 does not deposit thicker over blanket regions (i.e., peripheral region 212) than the sacrificial filler material 238 deposited over patterned regions with trenches (i.e., deep implantation region 214). Step 114 also removes the etch stop layer 232 over the blanket hardmask 226. An optional step 116 is performed where a protective layer is formed over the blanket hardmask 226 in the peripheral region 212. The protective layer may be another photoresist layer that is patterned to separate deep implantation region 214 and peripheral region 212. This patterning may be performed using a photolithography process having a lower resolution than the photolithography process that forms the hardmask patterns. For example, the additional protective layer is a photoresist patterned using an i-line stepper. The optional step 116 may be performed after step 114 where the etch stop layer 232 is removed over the tops of hardmask patterns 222 or after the sacrificial filler material 240 is deposited to prevent the etch stop layer 232 from being removed in step 114.

Figure 2G:
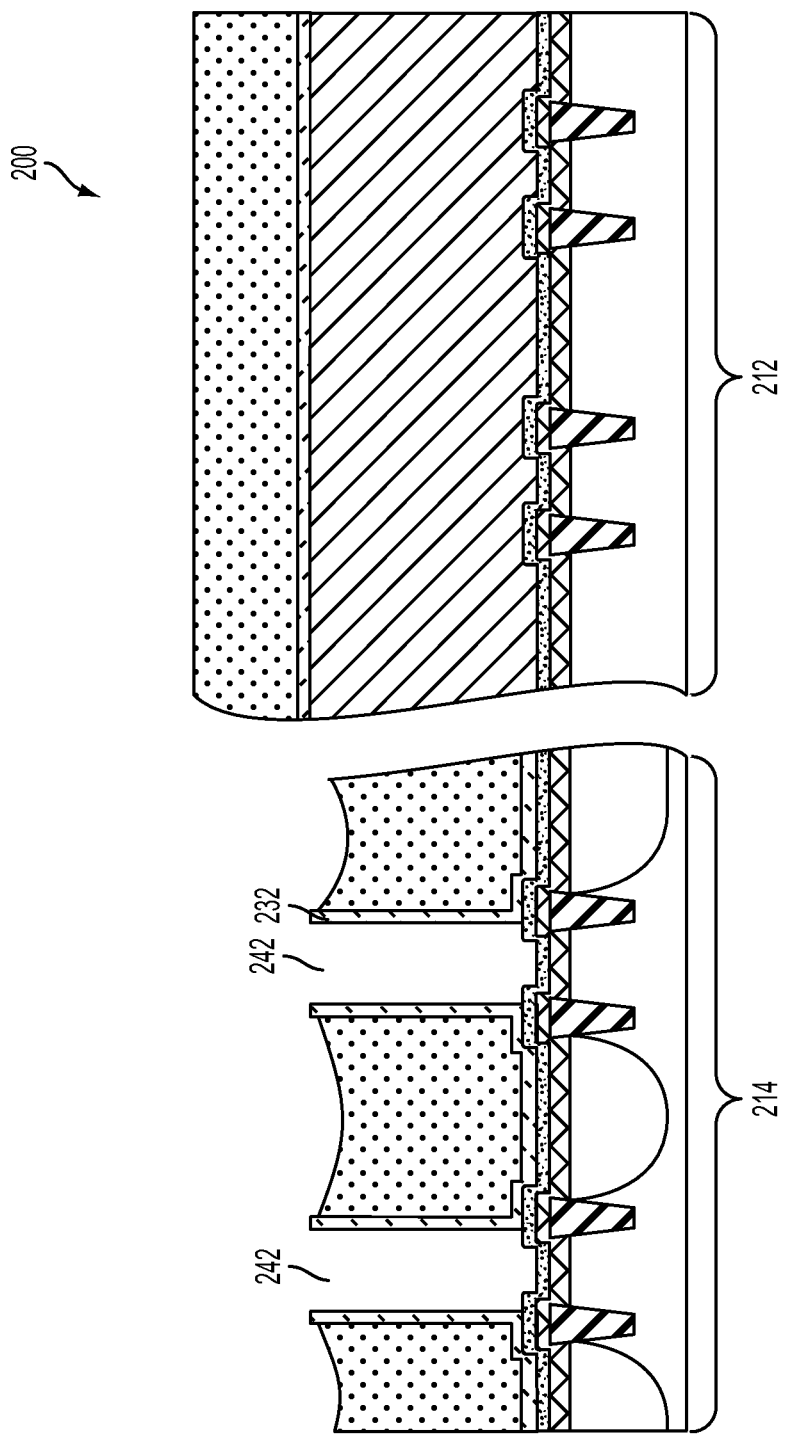

In step 118 of FIG. 1A, the hardmask pattern 222 in the deep implantation region 214 is removed by wet etching without removing the blanket hardmask 226 in the peripheral region 212. For oxide hardmasks, the wet etch may use a buffered or dilute hydrofluoric acid (HF) etchant, for example, with a 50:1 dilution. As shown in FIG. 2G, the etch stop layer 232 lines the resulting trenches 242. Because the etch stop layer 232 was conformally deposited onto the hardmask patterns 222, the trenches 242 have the same dimensions as the hardmask patterns 222. Because the hardmask patterns 222 was formed by etching trenches 220 in step 104 (see FIG. 2A) and the trenches 220 has a lower aspect ratio than trenches 242, the trenches 242 have little or tapering. The tapering angle of trenches 242 is less than trenches formed by etching directly in a hardmask. Trenches 242 have a high aspect ratio greater than or about 12, or greater than or about 15. The blanket hardmask 226 is not etched by the wet etch process because it is protected by the sacrificial material 240 of step 114 and/or the protective layer of step 116.

Figure 2H:
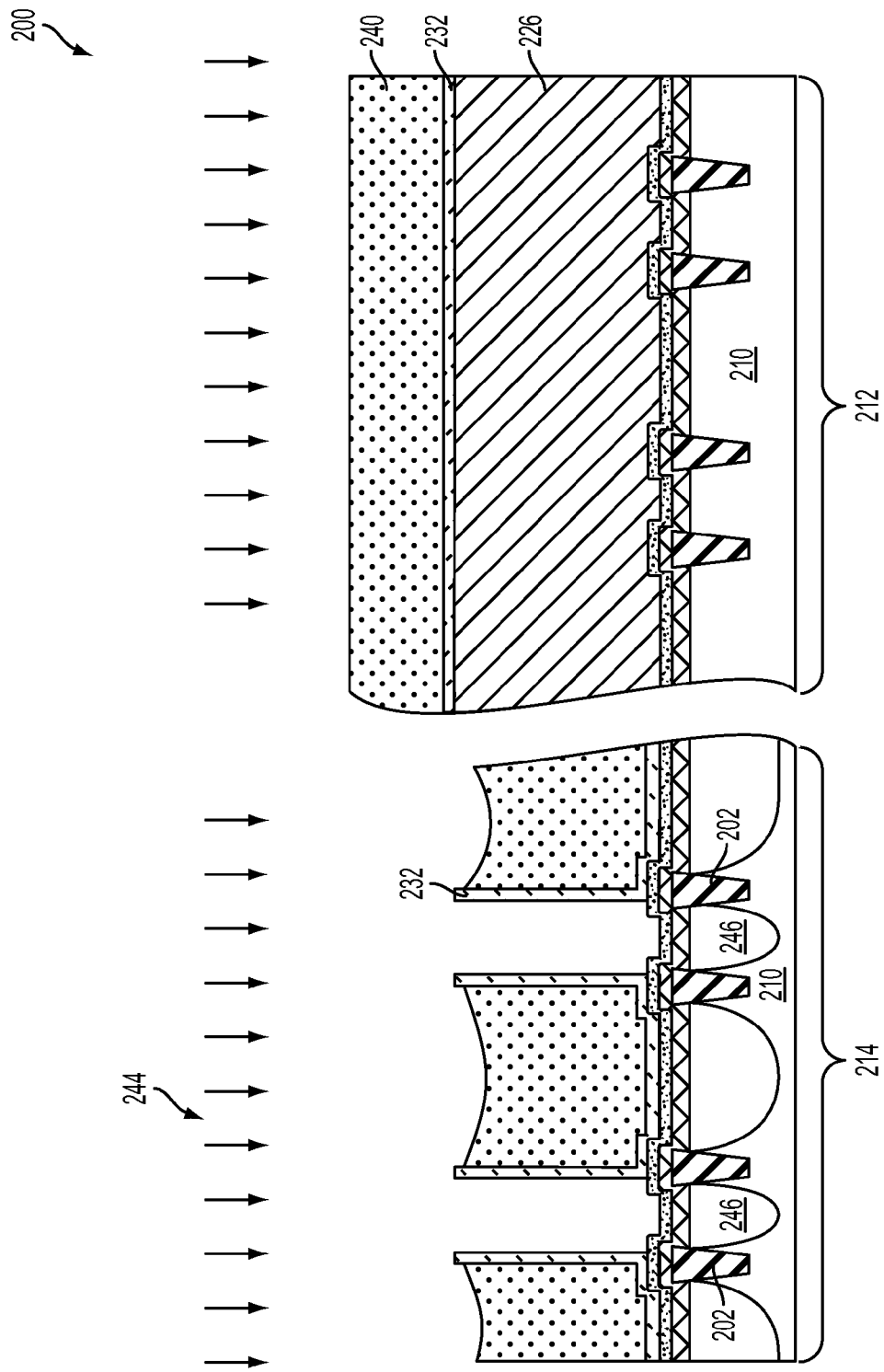

In step 120 of FIG. 1A, a second ion implantation with a second conductivity type dopant opposite of the first conductivity type is performed. Referring to FIG. 2H, the second ion implantation bombards the semiconductor device 200 with dopant ions 244 at a second implantation energy greater than 100 keV to form second wells 246 in the deep implantation region 214 in the substrate 210. The second wells 246 align with the etch stop layer 232 and/or the STI features 202. No well is formed in the peripheral region 212 as the sacrificial filler material 240, etch stop layer 232, and blanket hardmask 226 blocks the dopant ions 244 from being implanted. In the example of a CIS, the second conductivity-type is a p-type dopant for forming a deep p-well for isolating adjacent photo diodes. In other examples, the second conductivity-type may be n-type or p-type.

Figure 2I:
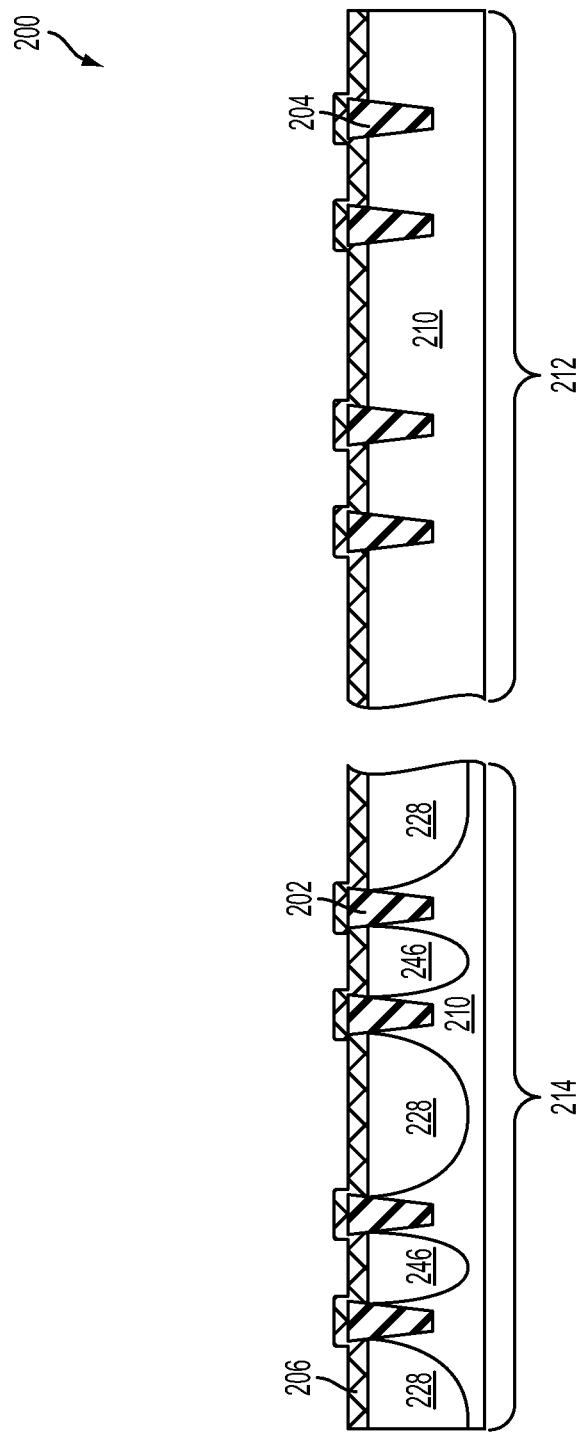

In step 122 of FIG. 1A, remaining etch stop layer 232, blanket hardmask 226 in the peripheral region 212, and the sacrificial filler material 240 are removed. A photoresist as the sacrificial filler material 240 may be removed by ashing and stripping. Other materials may be removed by dry etching or wet etching. The etch stop layer 232 and dielectric layer 108 may be removed by dry etch or wet etch. In one example, the etch stop layer 232 is a silicon nitride layer removed by wet etching with phosphoric acid ($H_3PO_4$). Referring to FIG. 2I, after step 122, the partially fabricated semiconductor device 200 includes a semiconductor substrate 210 with a deep implantation region 214 and a peripheral region 212. Each of the deep implantation region 214 and the peripheral region 212 includes a number of STI features 202 and 204, respectively, at least partially embedded in the semiconductor substrate 210. Between the STI features 202 in the deep implantation region 214 are various deep implantations 228 and 246. The deep implantations 228 and 246 may have different conductivity types, shapes and dopant concentrations. In at least one embodiment, deep implantations 228 are n-type photo diodes that are shallower than deep implantations 246, which are deep p-well used for isolating adjacent photo diodes.

The present disclosure also includes various embodiments where the distance between adjacent wells are controlled by changing the order of various steps and at least one embodiment where STI features are not used between adjacent wells. FIG. 1B is a flowchart of a method 150 for manufacturing a semiconductor device according to various embodiments of the present disclosure. The semiconductor device includes two or more deep implantations according to various aspects of the present disclosure. FIGS. 3A through 3F are sectional views of a semiconductor structure 300 at various fabrication stages and constructed according to various embodiments corresponding to some embodiments of the method 150.

Figure 3A:
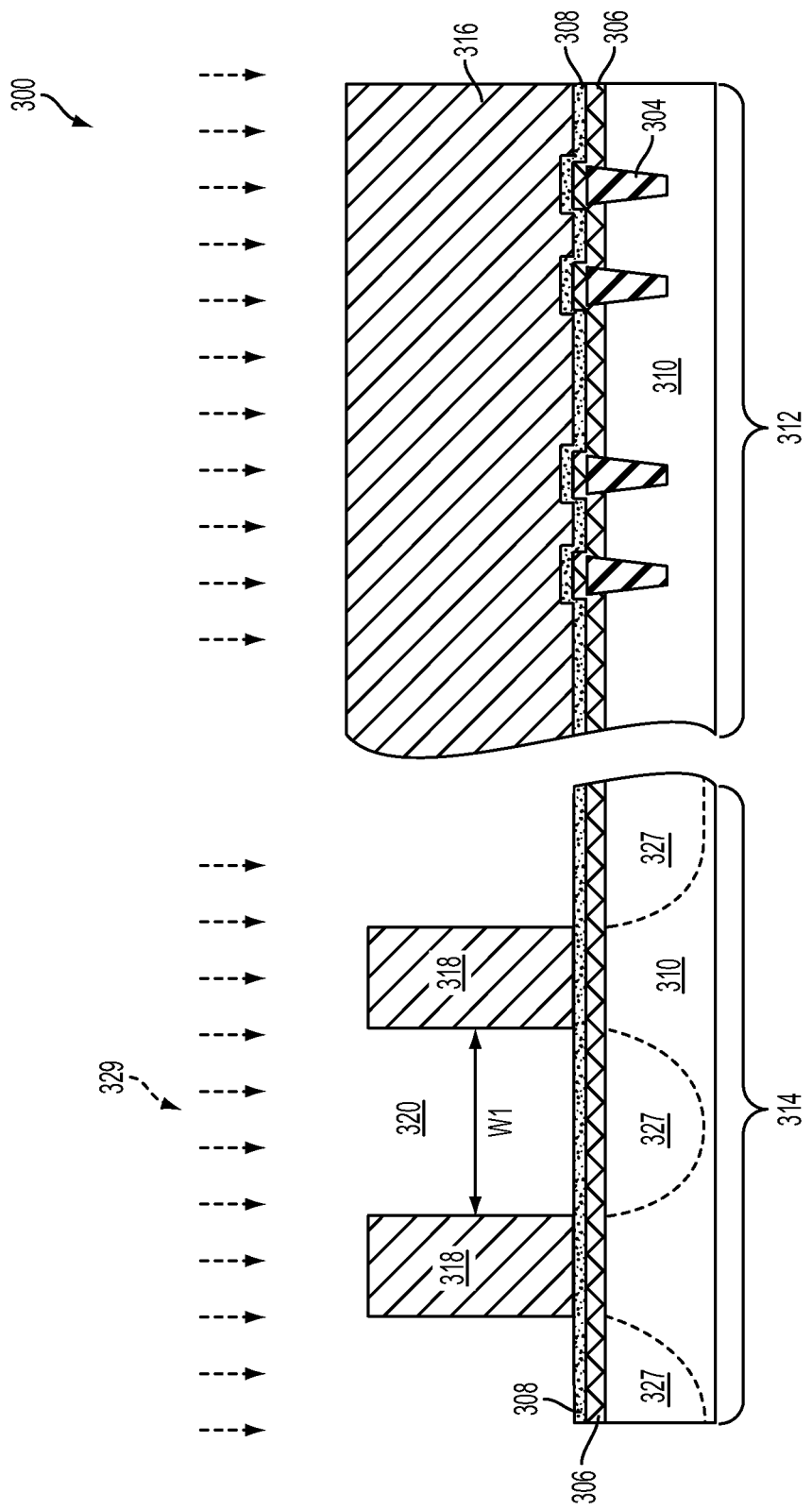
FIGS. 3A-3F are sectional views of a semiconductor structure having self-aligned deep implantation in various stages of semiconductor processing according to various embodiments of the present disclosure.

Referring to FIGS. 1B and 3A to 3F, the method 150 begins at step 152 by providing a semiconductor substrate 310. The semiconductor substrate 310 includes silicon having a deep implantation region 314 and a peripheral region 312 as shown in FIG. 3A. The difference between the semiconductor substrate 310 of FIG. 3A and the semiconductor substrate 210 of FIG. 2A is the lack of isolation features shown in the deep implantation region 314. While the method 150 may be implemented with isolation features between deep implantation features, its non-use may be an advantage for some device structures. As described herein, the method 150 can be used to accurately control the proximity of adjacent deep implantation wells. FIG. 3A includes STI features 304 in the peripheral region 312. Formation of STI features 304 have been described in association with FIG. 2A. The layers 306 and 308 over the semiconductor substrate 310 are the same as layers 206 and 208 over the semiconductor substrate 210 as described in associate with FIG. 2A.

In step 154 of FIG. 1B, a hardmask pattern 318 having a high aspect ratio is formed in the deep implantation region 314 and a blanket hardmask 316 is formed in the peripheral region 312. Referring to FIG. 3A, formation of the hardmask pattern 318 in the deep implantation region 314 with trenches 320 and the blanket hardmask 316 in the peripheral region 312 is the same operation as described in association with step 104 of FIG. 1A.

Referring back to FIG. 1B, after forming the hardmask pattern 318 the method 150 can proceed to one of three steps: step 156, step 158, or step 160. Particularly, step 156 may be performed first, after step 158, or after step 160. Step 158 may be omitted. In step 156, a first ion implantation with a first conductivity-type dopant is performed. In FIG. 3A, the first dopant ions 329 are shown to be implanted in deep implantation region 314 to form first wells 327, shown with dotted line as edges, between the hardmask patterns 318. The first wells 327 are aligned with the sidewalls with the hardmask pattern 318 with a width W1. First wells 327 correspond to performing step 156 without steps 158 and 160 or before steps 158 and 160. Details of the ion implantation process are described in association with step 108 of FIG. 1A.

Figure 3B:
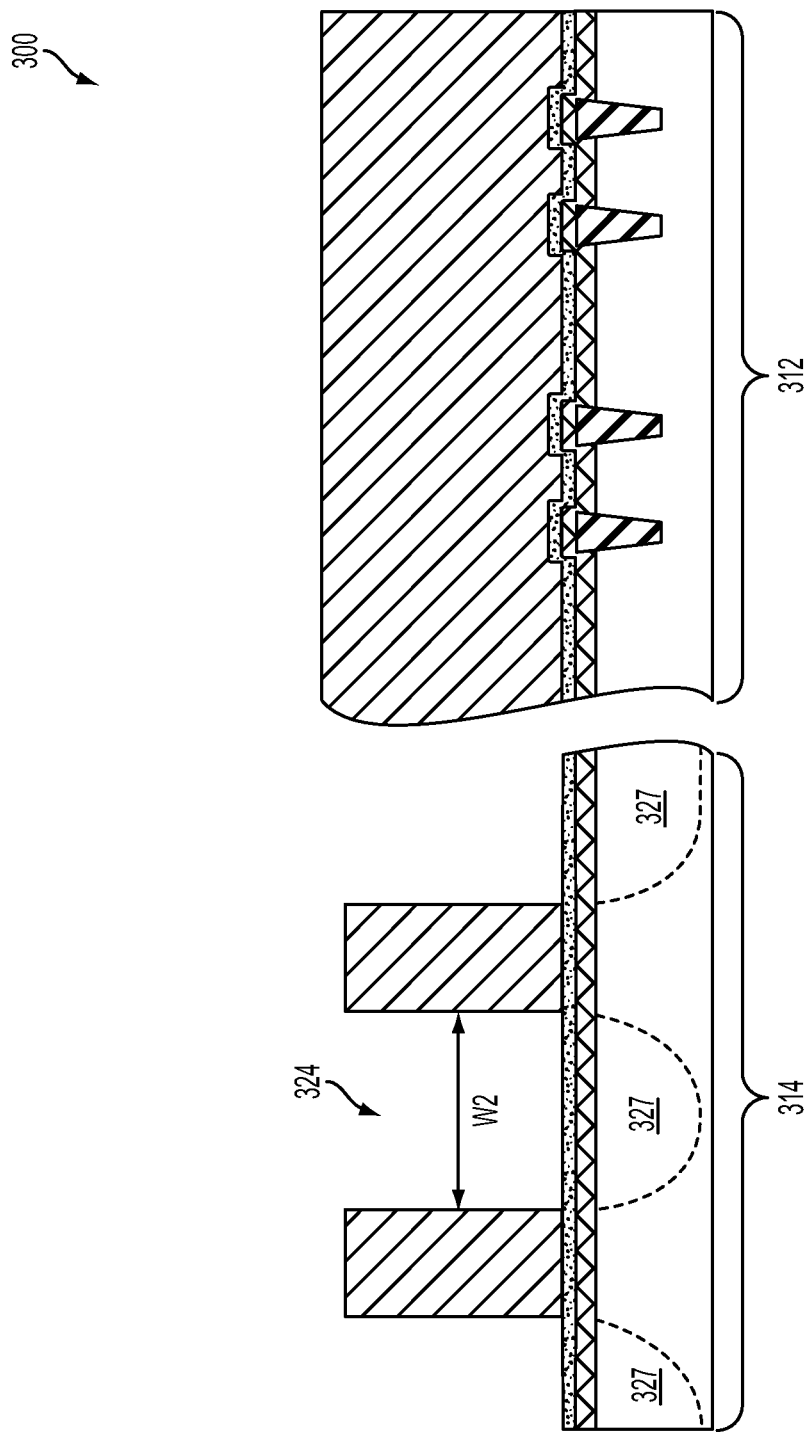
Figure 3C:
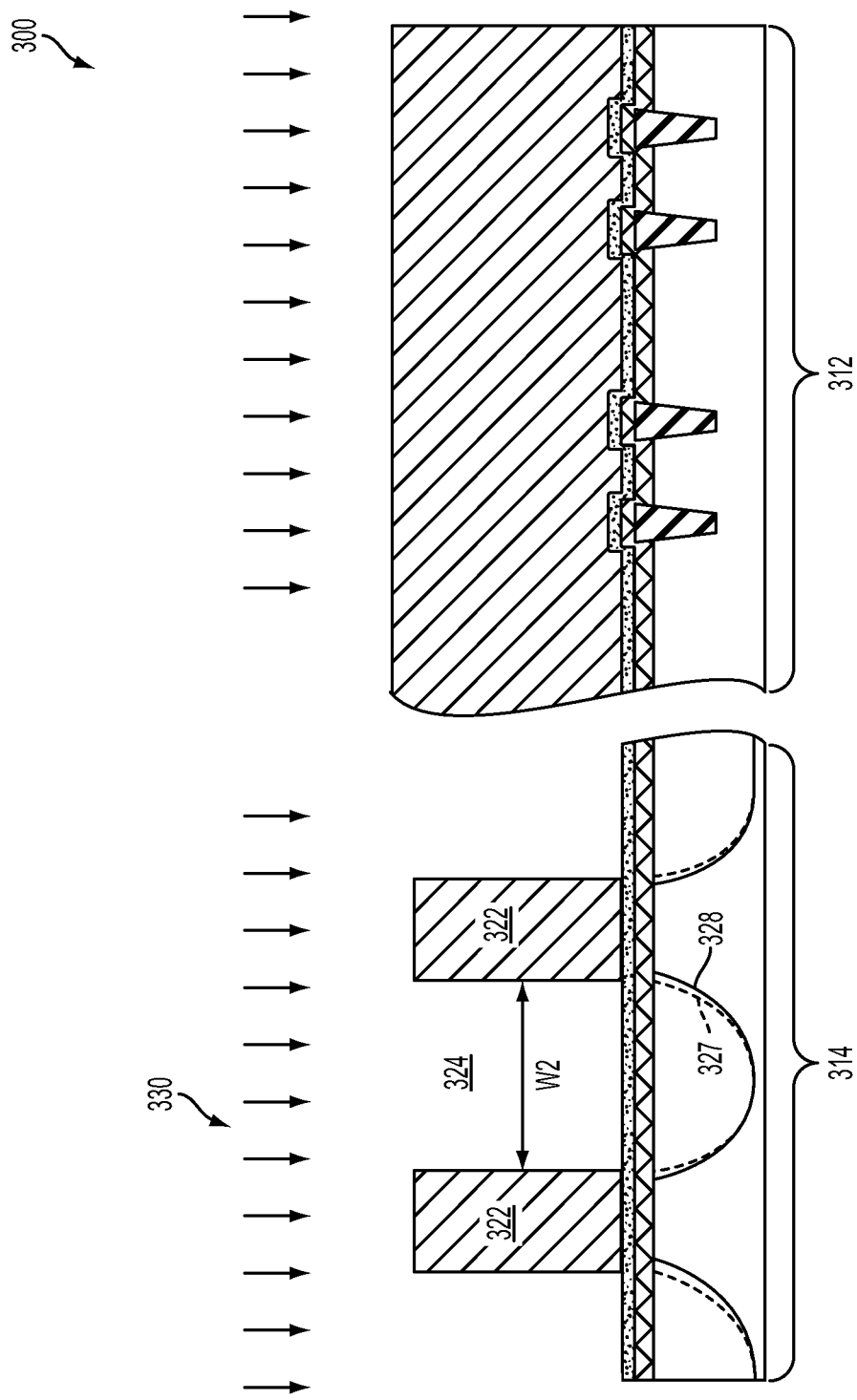

In optional step 158, the hardmask pattern dimension is reduced by wet etching to create a wider trench 324 as shown in FIG. 3B. The wider trench 324 has a width W2 that is greater than W1. Details of the dimension reducing process are described in association with step 106 of FIG. 1A. FIG. 3C is a cross section of a semiconductor device 300 where the first ion implantation step 156 is performed after optional step 158. In FIG. 3C, the first dopant ions 330 are shown to be implanted in deep implantation region 314 to form first wells 328, shown with solid line as edges, between the reduced dimension hardmask patterns 322. The first wells 328 are aligned with the sidewalls with the reduced dimension hardmask pattern 322 with a width W2. Comparing first wells 327 and 328, first well 328 is wider than first well 327. Given a same implantation process parameter, the depth of the first wells 327 and 328 should be about the same.

Figure 3D:
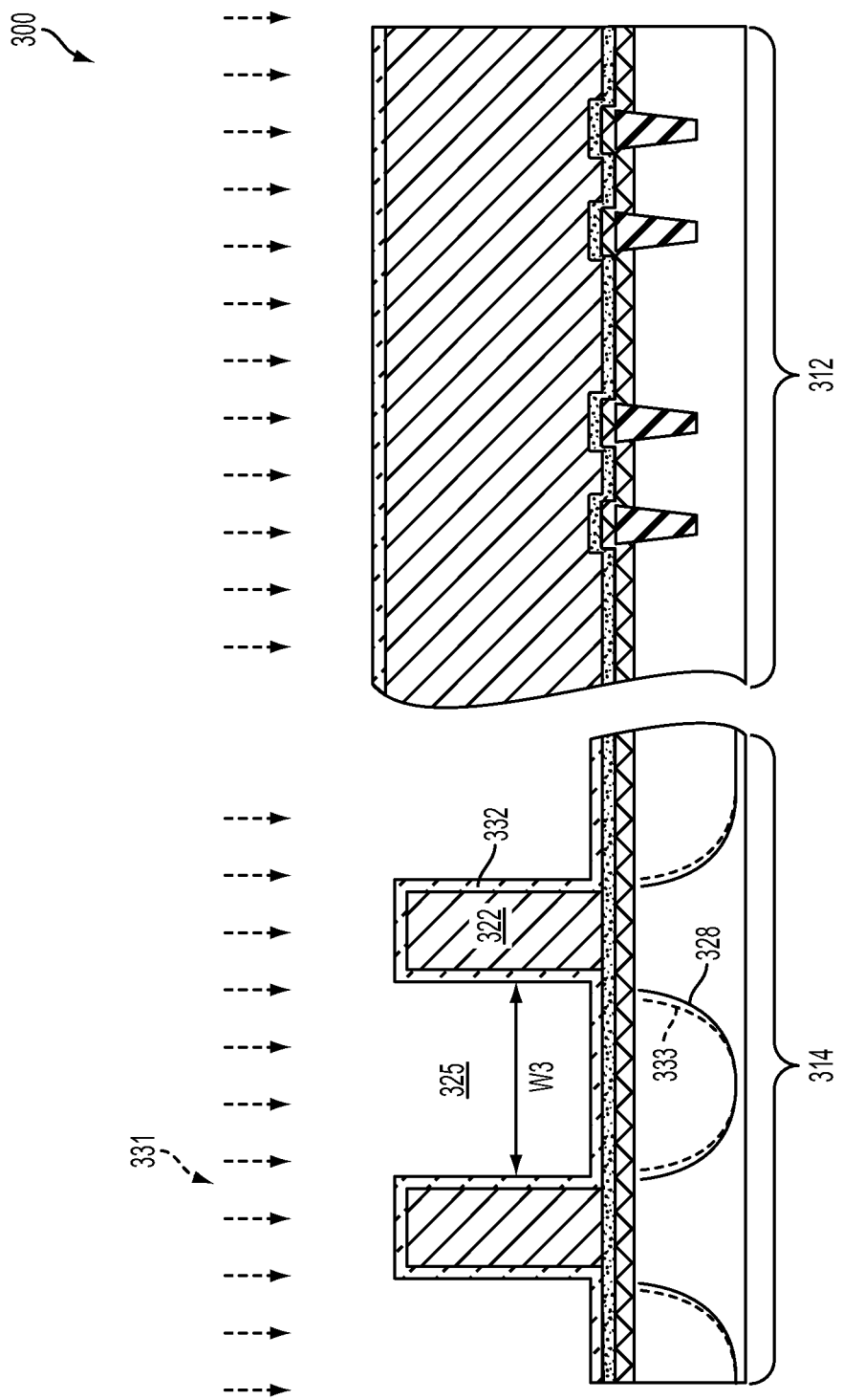

In step 160 of FIG. 1B, an etch stop layer 332 is deposited to form a conformal layer around the hardmask pattern 322 and in the bottom of the trenches 325, as shown in FIG. 3D. The etch stop layer 332 has a thickness that is determined according to the relative etch selectivity to the hardmask pattern 322. Details of the etch stop layer 332 deposition process are described in association with step 110 of FIG. 1A. After the etch stop layer 332 is deposited, trench 325 has a width W3 that is smaller than W2 of trench 324. W3 may be smaller or larger than W1 of trench 324, depending on the etch stop layer 332 thickness and the amount of etching in step 158.

The first ion implantation step 156 may be performed after step 160. In FIG. 3D, the first dopant ions 331 are shown to be implanted in deep implantation region 314 to form first wells 327, shown with dotted line as edges, between the etch stop layers 332 on the sidewalls of the trench 325 The first wells 328 are aligned with the etch stop layers 332 on the sidewalls of the trench 325. Comparing first wells 333 and 328, first well 333 is wider than first well 328. Given a same implantation process parameter, the depth of the first wells 333 and 328 should be about the same.

The remaining steps of FIG. 1B correspond to those of FIG. 1A. Specifically, step 162 of FIG. 1B corresponds to step 112 of FIG. 1A; step 164 of FIG. 1B corresponds to step 114 of FIG. 1A; and vice versa. Steps 162 to 172 of FIG. 1B are included so that FIGS. 1A and 1B discloses methods that results in partially fabricated semiconductors 200 and 300, respectively, at the same stage of manufacturing.

Figure 3E:
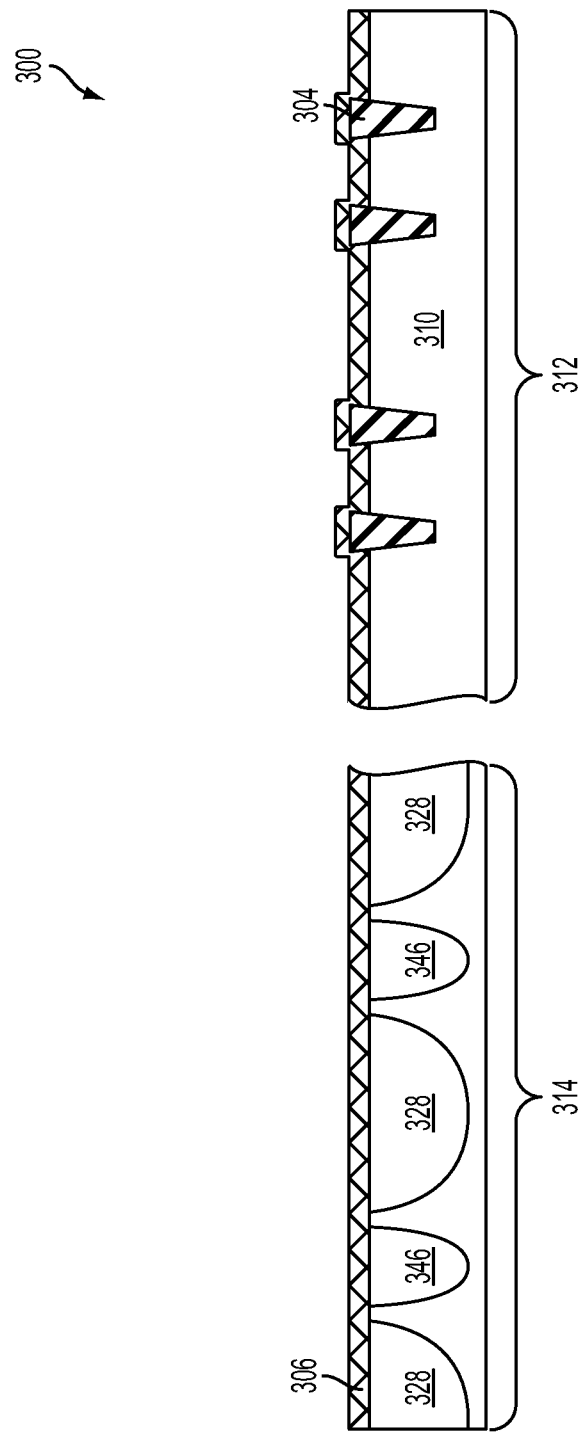

FIG. 3E is a cross section view of a partially fabricated semiconductor device 300 at a same stage of manufacturing as FIG. 2I, after steps 162 to 172 according to at least one embodiment of the methods of FIG. 1B. The semiconductor device 300 of FIG. 3E is formed by performing step 156 after step 158, if performed, and before step 160. The partially fabricated semiconductor device 300 includes a semiconductor substrate 310 with a deep implantation region 314 and a peripheral region 312. The peripheral region 312 includes a number of STI features 304 at least partially embedded in the semiconductor substrate 310. The deep implantation region 314 includes various deep implantations 328 and 346 that are formed adjoining to each other. The deep implantations 328 and 346 may have different conductivity types, shapes and dopant concentrations. In at least one embodiment, deep implantations 328 or 346 are used to form passive regions between active devices by forming a depletion region between adjoining deep implantations.

Figure 3F:
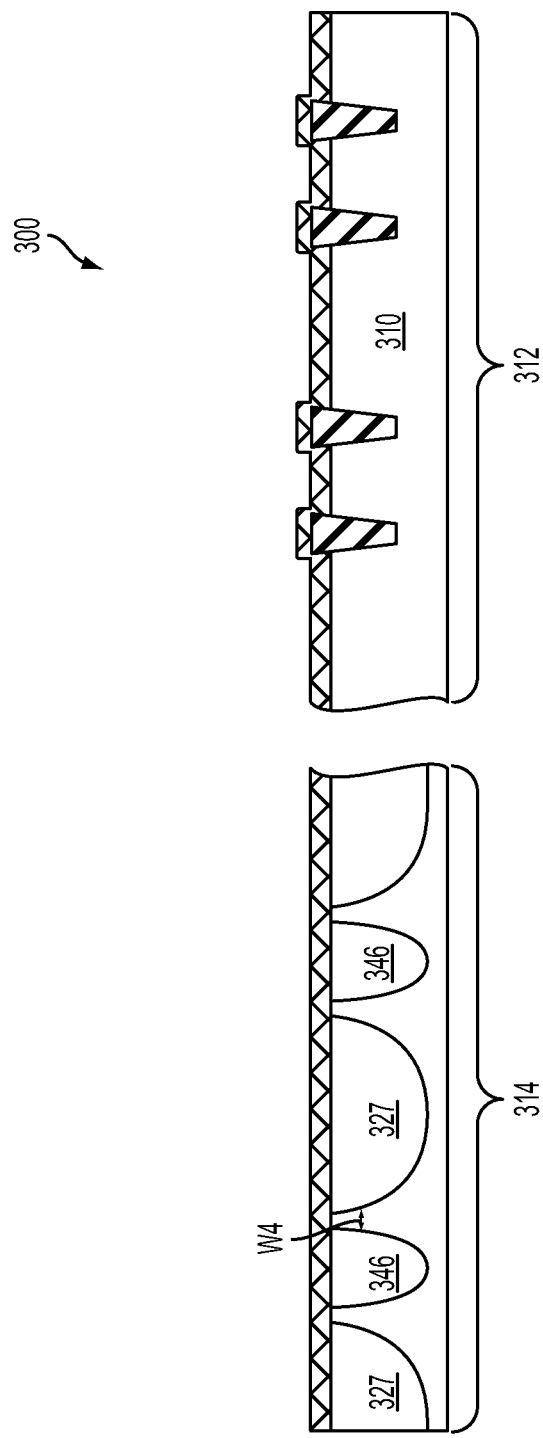

FIG. 3F is a is a cross sectional view of a partially fabricated semiconductor device 300 at a same stage of manufacturing as FIG. 2I, after steps 162 to 172 according to at least one embodiment of the methods of FIG. 1B. The semiconductor device 300 of FIG. 3F is formed by performing step 156 before step 158, if performed, and/or after step 160. The deep implantation region 314 includes various deep implantations 328 and 346 that are formed adjacent to each other with a distance W4 between them. The distance W4 depends on the thickness of the etch stop layer 332 deposited in step 160 or the amount of dimension reduction of the hardmask pattern 322 in step 158, if performed. If step 156 is performed before step 158, W4 is the amount of dimension reduction in step 158. If step 156 is performed after step 160, W4 is the thickness of the etch stop layer 332 deposited in step 160.

In certain embodiments, deep implantations 328 and 346 are parts of power devices such as bipolar junction transistors (BJT), bi-junction CMOS, and serial diodes suitable for high voltage and/or high frequency operation. In some embodiments, when deep implantation region 314 includes only a few deep implantations 328 and 346, for example, one pair of 328 and 346 between blanket hardmasks 316, then the deep implantations 328 and 346 may be parts of photodiodes, Schottky diodes, or form an ohmic contact for another device.

The methods of FIGS. 1A-1B and FIGS. 2A to 2I and FIGS. 3A to 3F do not require a second photomask for patterning the two deep implantations and thus remove the issue of having overlay margins that can unnecessarily enlarge a semiconductor device, saving up to 8% of the device area. The trench opening for the second deep implantation, usually the one with a higher aspect ratio can be made with smaller tapering than a trench opening etched through a hardmask. Be using the methods according to various embodiments, a trench with a smaller critical dimension (CD) and a good profile may be formed than with a method involving etching through a hardmask. The various methods of the present disclosure also improves costs by reducing the number of costlier processes and replacing some costlier processes with less expensive ones. For example, using the sacrificial filler material is less expensive than the oxide hardmask it replaces. In another example, the photolithography costs are reduced by using only one photomask or, if a protective layer is used over the peripheral region, replacing a photomask exposed with the more expensive excimer laser source with a less expensive i-line mercury lamp source.

The present disclosure is not limited to applications in which the semiconductor structure includes a photodiode or power devices and include semiconductor structures including FET (e.g. MOS transistor) or SRAM. For example, the semiconductor structures may include a dynamic random access memory (DRAM) cell, an imaging sensor, a capacitor and/or other microelectronic devices (collectively referred to herein as microelectronic devices).

It is understood that various different combinations of the above-listed embodiments and steps can be used in various sequences or in parallel. Furthermore, features illustrated and discussed above with respect to some embodiments can be combined with features illustrated and discussed above with respect to other embodiments. Accordingly, all such modifications are intended to be included within the scope of this invention.

What is claimed is:

1. A method comprising:
   providing a semiconductor substrate having a deep implantation region and a peripheral region;
   forming a hardmask pattern having a high aspect ratio in the deep implantation region and a blanket hardmask in the peripheral region;
   performing a first ion implantation with a first conductivity-type dopant;
   depositing an etch stop layer, wherein the etch stop layer conformally coats the hardmask pattern;
   filling trenches between the hardmask pattern with a sacrificial filler material having a higher wet etch resistance than the hardmask;
   removing a top portion of the sacrificial filler material and the etch stop layer over a top surface of the hardmask pattern;
   removing the hardmask pattern in the deep implantation region by wet etching;
   performing a second ion implantation with a second conductivity type dopant opposite of the first conductivity type; and,
   removing remaining etch stop layer, the blanket hardmask in the peripheral region, and the sacrificial filler material.

2. The method of claim 1, wherein the high aspect ratio is greater than 12.

3. The method of claim 1, wherein the forming a hardmask pattern comprises:
   depositing a hardmask material over the semiconductor substrate;
   etching a hardmask pattern in the deep implantation region.

4. The method of claim 3, further comprising
   reducing a dimension of the hardmask pattern by wet etching.

5. The method of claim 1, further comprising
   forming a protective layer over the blanket hardmask in the peripheral region before removing the hardmask pattern in the deep implantation region.

6. The method of claim 5, wherein the protective layer is a photoresist.

7. The method of claim 1, wherein the depositing the etch stop layer uses a process where a deposition over the blanket hardmask in the peripheral region is thicker than a deposition conformally coating the hardmask pattern in the deep implantation region.

8. The method of claim 1, wherein the sacrificial filler material is a photoresist.

9. The method of claim 1, wherein the wet etch selectivity between the hardmask pattern and the etch stop layer is about or greater than 15:1.

10. The method of claim 1, wherein the first or second implantation forms a deep p-well between photodiodes.

11. A method comprising:
providing a semiconductor substrate having a deep implantation region and a peripheral region;
depositing a hardmask material over the semiconductor substrate;
etching a hardmask pattern in the deep implantation region;
depositing an etch stop layer over the hardmask in the deep implantation region and the peripheral region, wherein the etch stop layer conformally coats the hardmask pattern;
performing a first ion implantation with a first conductivity-type dopant;
filling trenches between the hardmask pattern with a sacrificial filler material having a higher wet etch resistance than the hardmask;
removing a top portion of the sacrificial filler material and the etch stop layer over a top surface of the hardmask pattern;
removing the hardmask pattern in the deep implantation region by wet etching;
performing a second ion implantation with a second conductivity type dopant opposite of the first conductivity type; and,
removing remaining etch stop layer, the blanket hardmask in the peripheral region, and the sacrificial filler material.

12. The method of claim 11, further comprising reducing a dimension of the hardmask pattern by wet etching before depositing the etch stop layer.

13. The method of claim 12, wherein the performing a first ion implantation occurs before depositing the etch stop layer.

14. The method of claim 11, wherein the wet etching comprises exposing the hardmask pattern to a dilute or buffer hydrofluoric acid solution.

15. The method of claim 11, further comprising
forming a protective layer over the blanket hardmask in the peripheral region before removing the hardmask pattern in the deep implantation region.

16. The method of claim 15, wherein the protective layer is a negative photomask.

17. The method of claim 11, wherein the first conductivity type is p-type.

18. The method of claim 1, wherein the wet etch selectivity between the hardmask pattern and the etch stop layer is about or greater than 20:1.

19. The method of claim 11, wherein the filling the trenches between the hardmask pattern with the sacrificial filler material further includes covering the etch stop layer over the peripheral region with the sacrificial filler material.

20. The method of claim 19, wherein a top surface of the sacrificial filler material over the peripheral region is further from the semiconductor substrate than a top surface of the sacrificial material over the deep implantation region.

* * * * *